(12) United States Patent
Wilson

(10) Patent No.: US 7,064,424 B2
(45) Date of Patent: Jun. 20, 2006

(54) OPTICAL SURFACE MOUNT TECHNOLOGY PACKAGE

(76) Inventor: Robert E. Wilson, 2585 Louis Rd., Palo Alto, CA (US) 94303

( * ) Notice: Subject to any disclaimer, the term of this patent is extended or adjusted under 35 U.S.C. 154(b) by 72 days.

(21) Appl. No.: 10/841,897

(22) Filed: May 6, 2004

(65) Prior Publication Data
US 2005/0248008 A1    Nov. 10, 2005

(51) Int. Cl.
*H01L 23/02* (2006.01)
(52) U.S. Cl. ...................... 257/680; 438/116
(58) Field of Classification Search ............... 257/680; 438/116
See application file for complete search history.

(56) References Cited

U.S. PATENT DOCUMENTS

2005/0009239 A1*  1/2005  Wolff et al. .................. 438/123

* cited by examiner

Primary Examiner—Roy Potter

(57) ABSTRACT

A semiconductor package includes a package substrate, an optical device die atop the package substrate, a transparent optical element atop the die, an optional dam around the die, and an encapsulant entirely covering the die and partially covering the transparent optical element.

28 Claims, 5 Drawing Sheets

OPTICAL SURFACE MOUNT TECHNOLOGY PACKAGE

DESCRIPTION OF RELATED ART

A surface mount technology (SMT) package for optical devices finds application in fiber optics (FO). There is a wide variety of SMT packages available in the industry today for non-optical devices such as silicon integrated circuits (ICs). Options include leaded packages molded in epoxy, ceramic ball grid array (BGA), laminate BGAs and many others. These IC packages are available with thermally enhanced versions, multi-chip versions, low-cost versions, etc. No such abundance of optical SMT packages exists.

One of the least expensive ways to package an IC is chip-on-board (COB) as shown in FIG. 1. A die 12 is mounted directly onto a printed circuit board (PCB) 14 and wire bonds 16 make the connection between the traces on die 12 and traces on PCB 14. As shown in FIG. 2, environmental protection is provided by covering the device with an opaque epoxy 18 called "globtop." To reduce the coefficient of thermal expansion (CTE) of epoxy 18 so that thermal cycling does not overstress wire bonds 16, the globbing epoxy is heavily "filled" with a material that has a similar CTE as PCB 14. Since filling materials (often silicon dioxide) are not transparent, COB 10 is generally not useful for optical devices. Thus, what is needed is a SMT package for optical devices.

SUMMARY

In one embodiment of the invention, a semiconductor package includes a package substrate, an optical device die atop the package substrate, a transparent optical element atop the die, an optional dam around the die, and an encapsulant entirely covering the die and partially covering the transparent optical element.

BRIEF DESCRIPTION OF THE DRAWINGS

Use of the same reference numbers in different figures indicates similar or identical elements.

DETAILED DESCRIPTION

Figure 1:
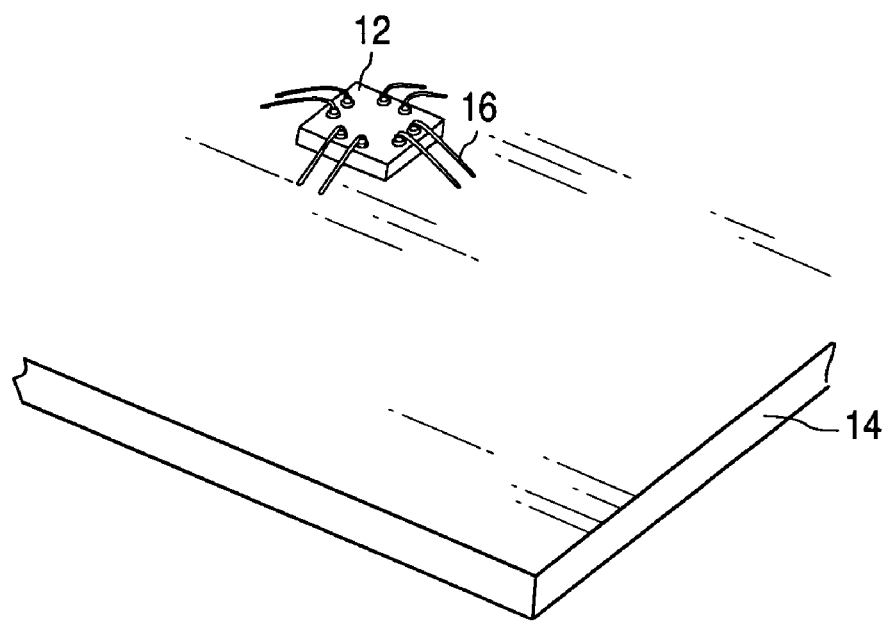
FIGS. 1 and 2 illustrate a conventional chip-on-board package.
Figure 2:
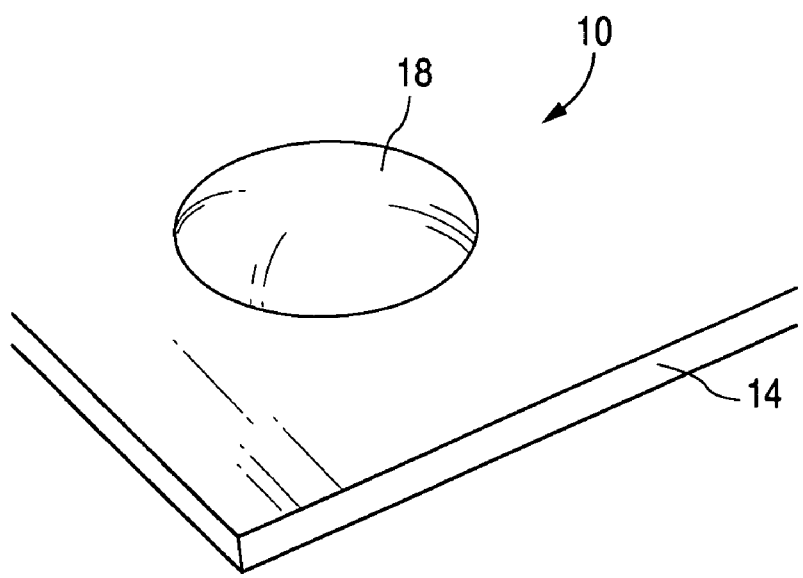
Figure 3:
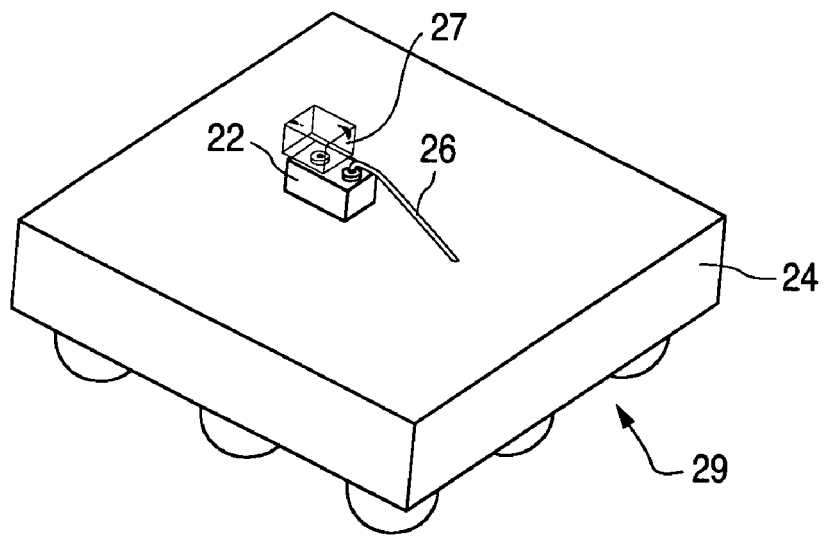
FIGS. 3 and 4 illustrate a package for an optical device in one embodiment of the invention.
Figure 4:
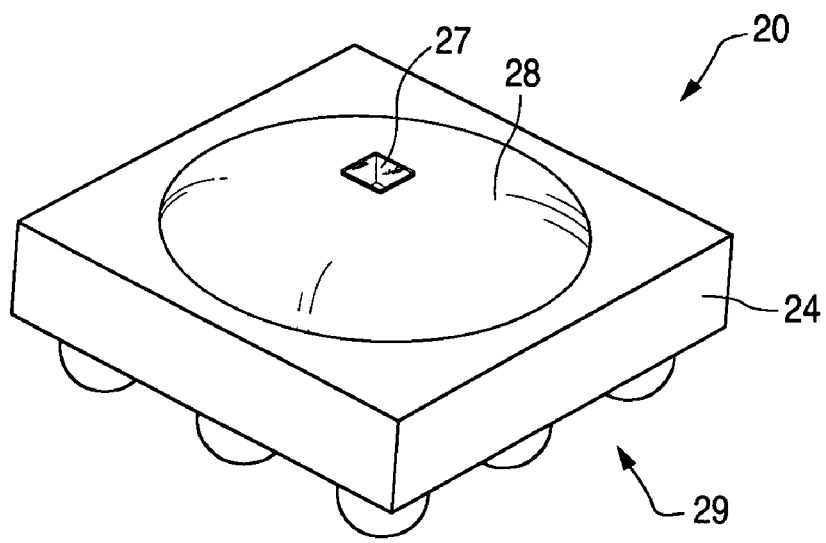

FIGS. 3 and 4 illustrate a surface mount technology (SMT) package 20 for optical devices in one embodiment of the invention. A die 22 is mounted on a package substrate 24. Die 22 includes an optical device such as a vertical cavity surface emitting laser (VCSEL), a light emitting diode (LED), or a photodiode. Package substrate 24 can be a printed circuit board (PCB) or a ceramic substrate. The bottom surface of package substrate 24 can be populated with a ball grid array (BGA) 29 to make the electrical connection to another substrate (e.g., a user's PCB). A trace on die 22 is connected by a wire bond 26 to a trace on package substrate 24.

A transparent optical element 27 is mounted on die 22 to create a window through a "globtop," which is formed by depositing an encapsulant 28 over package substrate 24. In one embodiment, window 27 is a rectangular piece of glass or quartz and encapsulant 28 is an epoxy filled with a material to provide similar coefficient of thermal expansion (CTE) as package substrate 24. The required transparency of window 27 is application specific (e.g., 10% to 100%). In one embodiment, window 27 is a lens that directs light, a filter that passes light of a certain wavelength, or a combination thereof. For environmental protection, encapsulant 28 is deposited on package substrate 24 to entirely cover die 22 and partially cover window 27. Window 27 is partially covered when its top surface is free of encapsulant 28 so that light can escape from or enter into die 22.

Figure 5:
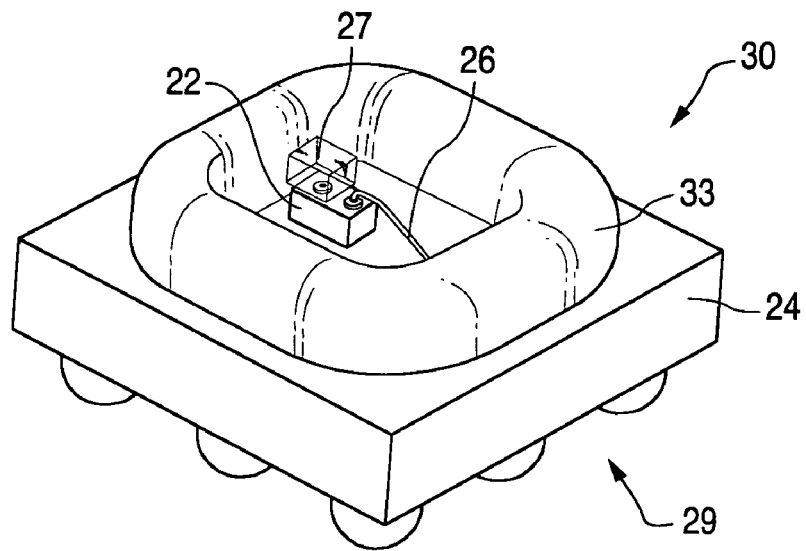
FIGS. 5 and 6 illustrate a package for an optical device in another embodiment of the invention.
Figure 6:
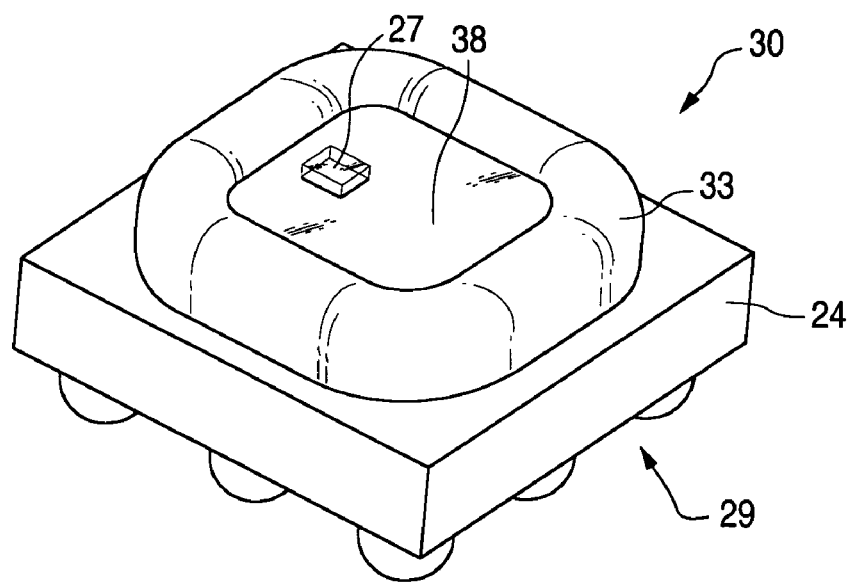

FIGS. 5 and 6 illustrate a SMT package 30 for optical devices in one embodiment of the invention. Similar to package 20, package 30 includes die 22, package substrate 24, wire bond 26, and window 27. Package 30 further includes a dam 33 formed around die 22, wire bond 26, and window 27 on package substrate 24. Dam 33 has a height greater than die 22 so it can be filled with an encapsulant 38 to entirely cover die 22 and partially cover window 27. This results in a substantially flat globtop with a slightly protruding window 27. In one embodiment, encapsulant 38 is similar to encapsulant 28. As shown, dam 33 has a generally rectangular shape with rounded corner but other shapes can be used to surround the components to be protected by encapsulant 38. In one embodiment, dam 33 is an epoxy that has the desired viscosity and flow properties to form the walls of the dam (e.g., a thixotropic epoxy).

Package 30 has several advantages. First, it is easy to control the amount of encapsulant 38 to dispense because the volume of material is confined within dam 33. Second, dam 33 produces a flat globtop that is easy to handle with vacuum pick-up heads used in conventional manufacturing processes.

Figure 7:
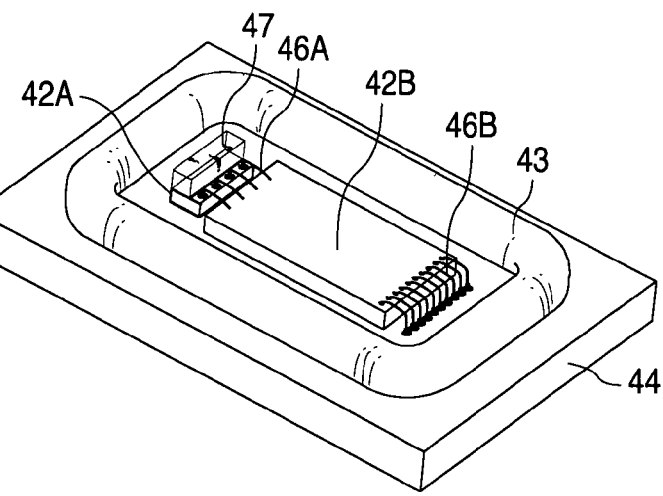
FIGS. 7, 8, and 9 illustrate a package for an optical device in another embodiment of the invention.
Figure 8:
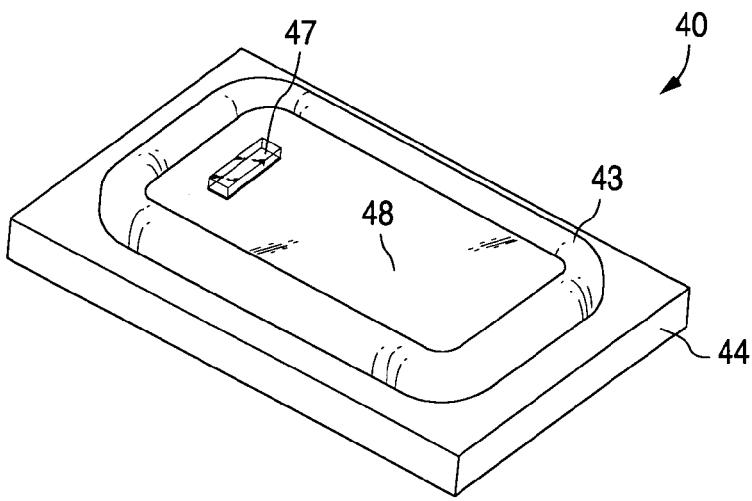
Figure 9:
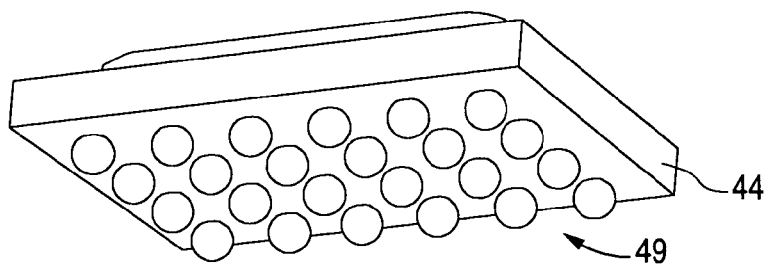

FIGS. 7, 8, and 9 illustrate a SMT package 40 for optical devices in one embodiment of the invention. Package 40 is similar to package 30. Instead of die 22, package 40 includes a die 42A that has multiple optical devices (e.g., four VCSELs). Furthermore, package 40 includes another die 42B that has the driver IC for the optical devices. Traces on dies 42A and 42B are connected by wire bonds 46A while traces on die 42B and package substrate 44 are connected by wire bonds 46B. For example, package 40 encompasses a four channel transmitter with the transmitter driver IC included in the package. As can be seen, a larger window 47 is mounted atop die 42A. A dam 43 surrounds die 42A, die 42B, wire bonds 46A, and wire bonds 46B. An encapsulant 48 fills dam 43 to entirely cover die 42A, die 42B, wire bonds 46A, and wire bonds 46B, and to partially cover window 47. The bottom of package substrate 44 can be populated with a BGA 49 to make the electrical connection to another substrate (e.g., a user's PCB).

Figure 10:
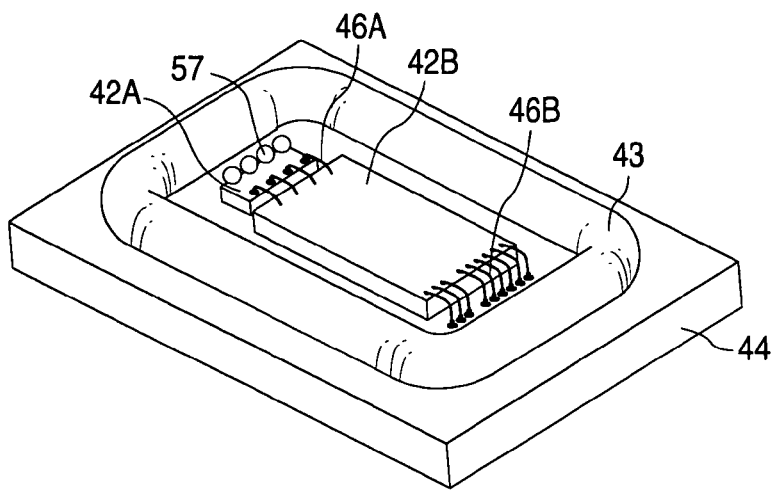
FIGS. 10 and 11 illustrate a package for an optical device in another embodiment of the invention.
Figure 11:
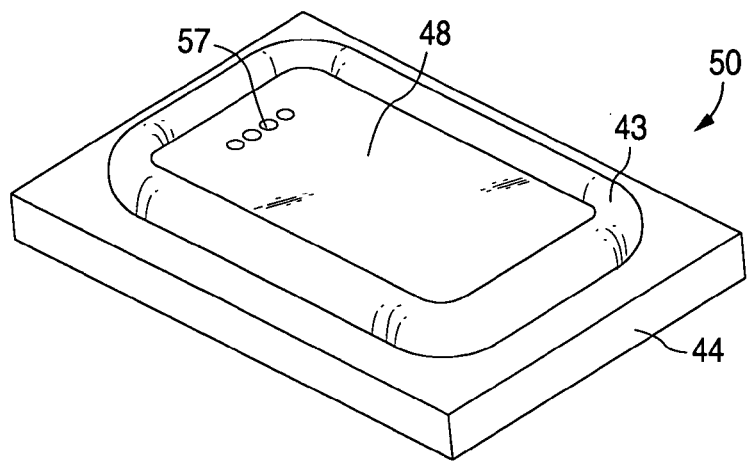

FIGS. 10 and 11 illustrate a SMT package 50 for optical devices in one embodiment of the invention. Package 50 is similar to package 40 except that window 47 has been replaced with lenses 57 (only one labeled for clarity) for each optical device. In one embodiment, lenses 57 are each a transparent spherical lens mounted atop die 42A over a corresponding optical device to direct light from or to the corresponding optical device.

Figure 12:
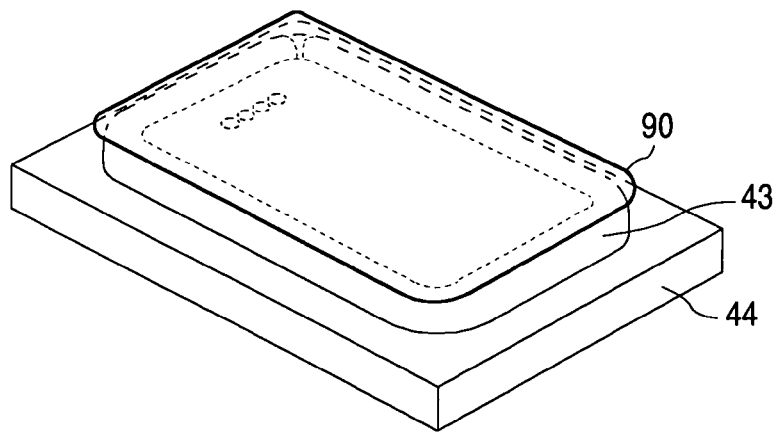
FIG. 12 illustrates a method to protect one embodiment of the package during the assembly process in one embodiment of the invention.

FIG. 12 illustrates that if any of the packages described above (e.g., package 50) needs to be protected during the assembly process, the top of the package can be covered with a piece a tape 90.

Various other adaptations and combinations of features of the embodiments disclosed are within the scope of the invention. Numerous embodiments are encompassed by the following claims.

What is claimed is:

1. A semiconductor package comprising:
a package substrate;
a die atop the package substrate, the die comprising an optical device;
a transparent optical element atop the die;
a dam surrounding the die; and
an encapsulant within the dam, wherein the encapsulant entirely covers the die and partially covers the transparent optical element.

2. The package of claim 1, wherein the transparent optical element is selected from the group consisting of a filter and a lens.

3. The package of claim 2, wherein the lens is selected from the group consisting of a rectangular lens and a spherical lens.

4. The package of claim 1, wherein the dam comprises a thixotropic epoxy.

5. The package of claim 1, wherein the dam is rectangular with rounded corners.

6. The package of claim 1, wherein the optical device is selected from the group consisting of a laser, a light emitting diode, and a photodiode.

7. The package of claim 6, further comprising another die located inside the dam and covered by the encapsulant, said another die comprising a circuit driving the optical device.

8. A semiconductor package comprising:
a package substrate;
a die atop the package substrate, the die comprising an optical device;
a transparent optical element atop the die;
an encapsulant entirely covering the die and partially covering the transparent optical element;
wherein the package substrate is selected from the group consisting of a printed circuit board and a ceramic substrate.

9. A semiconductor package comprising:
a package substrate comprising a ball grid array on a bottom surface;
a die atop the package substrate, the die comprising an optical device;
a transparent optical element atop the die; and
an encapsulant entirely covering the die and partially covering the transparent optical element.

10. The package of claim 1, wherein the die comprises an array of optical devices.

11. The method of claim 13, wherein the transparent optical element is selected from the group consisting of a filter and a lens.

12. The method of claim 11, wherein the lens is selected from the group consisting of a rectangular lens and a spherical lens.

13. A method for creating a semiconductor package comprising:
mounting a die atop a package substrate, the die comprising an optical device;
mounting a transparent optical element atop the die;
forming a dam around the die;
depositing an encapsulant within the dam to entirely cover the die and to partially cover the transparent optical element.

14. The method of claim 13, wherein the dam comprises a thixotropic epoxy.

15. The method of claim 13, wherein said forming a dam comprises forming a rectangular dam with rounded corners.

16. The method of claim 13, wherein the optical device is selected from the group consisting of a laser, a light emitting diode, and a photodiode.

17. The method of claim 16, further comprising, prior to said depositing an encapsulant, mounting another die on the package substrate, said another die comprising a circuit driving the optical device, wherein the dam surrounds the die and said another die and the encapsulant covers the die and said another die.

18. A method for creating a semiconductor package comprising:
mounting a die atop a package substrate, the die comprising an optical device and the package substrate being selected from the group consisting of a printed circuit board and a ceramic substrate;
mounting a transparent optical element atop the die; and
depositing an encapsulant to entirely cover the die and to partially cover the transparent optical element.

19. A method for creating a semiconductor package comprising:
mounting a die atop a package substrate the die comprising an optical device and the package substrate comprising a ball grid array on a bottom surface;
mounting a transparent optical element atop the die; and
depositing an encapsulant to entirely cover the die and to partially cover the transparent optical element.

20. The method of claim 13, wherein the die comprises an array of optical devices.

21. The package of claim 8, wherein the transparent optical element is selected from the group consisting of a filter and a lens.

22. The package of claim 21, wherein the lens is selected from the group consisting of a rectangular lens and a spherical lens.

23. The package of claim 9, wherein the transparent optical element is selected from the group consisting of a filter and a lens.

24. The package of claim 23, wherein the lens is selected from the group consisting of a rectangular lens and a spherical lens.

25. The method of claim 18, wherein the transparent optical element is selected from the group consisting of a filter and a lens.

26. The method of claim 25, wherein the lens is selected from the group consisting of a rectangular lens and a spherical lens.

27. The method of claim 19, wherein the transparent optical element is selected from the group consisting of a filter and a lens.

28. The method of claim 27, wherein the lens is selected from the group consisting of a rectangular lens and a spherical lens.

* * * * *